(12) United States Patent
Hajnal

(10) Patent No.: US 6,492,810 B1
(45) Date of Patent: Dec. 10, 2002

(54) ANTI-ALIASING MAGNETIC RESONANCE DEVICE WHICH REDUCES ALIASING FROM REGIONS OUTSIDE OF THE EXCITATION VOLUME

(75) Inventor: Jospeh Vilmos Hajnal, London (GB)

(73) Assignee: Koninklijke Philips Electronics N.V. (NL)

(*) Notice: Subject to any disclaimer, the term of this patent is extended or adjusted under 35 U.S.C. 154(b) by 0 days.

(21) Appl. No.: 09/523,898

(22) Filed: Mar. 13, 2000

(30) Foreign Application Priority Data

Mar. 13, 1999 (GB) .............................. 9905727

(51) Int. Cl.[7] .............................................. G01V 3/00
(52) U.S. Cl. ........................ 324/309; 324/318; 324/307
(58) Field of Search ................................. 324/309, 318, 324/307, 311, 312, 319, 320, 322, 314, 306

(56) References Cited

U.S. PATENT DOCUMENTS

| 4,715,383 | A | * | 12/1987 | Ehman et al. ............... 600/410 |
| 5,386,190 | A | * | 1/1995 | Takeuchi et al. ............ 324/309 |
| 5,451,875 | A | * | 9/1995 | Patrick et al. ............... 324/318 |
| 5,633,585 | A |   | 5/1997 | Kuhn ........................... 324/307 |
| 6,100,689 | A | * | 8/2000 | Huff et al. ................... 324/309 |
| 6,307,373 | B1 | * | 10/2001 | Young ........................... 324/322 |
| 6,380,741 | B1 | * | 4/2002 | Hajnal et al. ................ 324/318 |
| 6,396,269 | B1 | * | 5/2002 | Hajnal et al. ................ 324/307 |

OTHER PUBLICATIONS

Kruger et al., article "An Orthogonal Correlation Algorithm for Ghost Reduction in MRI". Magnetic Resonance in Medicine No. 38 pp. 678–686 1997. (No month).*

J. B. Ra, and C. Y. Rim, article "Fast Imaging Using Subencoding Data Sets from Multiple Detectors". Magnetic Resonance in Medicine No. 30 pp. 142–145 1993. (No month).*

* cited by examiner

Primary Examiner—Edward Lefkowitz
Assistant Examiner—Tiffany A. Fetzner
(74) Attorney, Agent, or Firm—John J. Fry; Thomas M. Lundin

(57) ABSTRACT

In magnetic resonance apparatus, particularly magnetic resonance imaging apparatus, it is found that magnetic resonance signals generated in an alias region (D) will be aliased into the signals received by the primary receive coil (4) from the desired signal region (A–B). An additional receive coil 5 is provided to receive the signals from the alias region, and processing means (6) reduces the effect of these alias signals on the resulting desired data.

20 Claims, 2 Drawing Sheets

ANTI-ALIASING MAGNETIC RESONANCE DEVICE WHICH REDUCES ALIASING FROM REGIONS OUTSIDE OF THE EXCITATION VOLUME

BACKGROUND OF THE INVENTION

This invention relates to magnetic resonance (MR) apparatus. The invention is especially concerned with the reduction of artefacts caused by so-called "aliasing" in magnetic resonance images in magnetic resonance imaging apparatus, and the reduction of artefacts caused by aliasing in magnetic resonance spectroscopy apparatus.

Magnetic resonance apparatus comprises a magnet for producing a main magnetic field to align magnetic resonant active nuclei such as hydrogen in tissue in a patient, and radio frequency excitation means such as a radio frequency coil to excite these nuclei to resonance. The resulting relaxation signals generated by the nuclei are picked up by a receive coil or coils, which may be separate from the transmit coil or may be one and the same coil(s). The signals provide information on the distribution of the nuclei and hence information about the tissue itself. Spatial information on the distribution of the nuclei, in magnetic resonance imaging, is obtained by spatially encoding the MR signal by means for generating magnetic field gradients.

In any magnetic resonance imaging apparatus, the region selected for imaging is within the region of good field produced by the magnetic system. The requirements for the region of good field is that the field of the main magnet must be homogeneous to a very high degree, and the magnetic field gradients imposed on the main field must be uniform to a very high degree.

Thus, referring to FIGS. 1 and 2, in one design of magnetic resonance imaging (MRI) apparatus, the magnet 1 receives patients on a couch 2 into a cylindrical bore 3, and the region of good field extends between radial planes A and B.

In the case of a radial slice being imaged, the particular slice which is selected is determined by the frequency of the radio frequency excitation pulse, which excites nuclei precessing at a certain frequency. The frequency at which the nuclei precess is dependent on the magnetic field strength. For example, in FIG. 1, the axial gradient results in the magnetic field strength increasing (in a linear manner) in an axial direction from A to B. Unfortunately, where the gradient field and the main magnetic field strength fall off, the resultant magnetic field will pass through the same values as over the linear region. Thus, the region D is subject to the same magnetic field strength as the slice B. When slice B is excited, region D will also be excited, and a certain amount of the MR signal generated in region D will be picked up by the radio frequency coil 4 and be processed as if it had been generated by the selected slice B.

This is the problem referred to as aliasing, and is responsible for generating artefacts in the image produced by the MRI apparatus. This is a particular problem with shorter magnets, which have been proposed to reduce problems of claustrophobia, because the fall off now takes place closer to the region of good field than hitherto. Hence, it is more difficult to arrange that no part of the patient lies in the alias region during imaging.

Various proposals have been made to alleviate this problem of aliasing. Thus, it has been proposed to shield alias regions such as D in FIG. 2 from the excitation pulse generated by the radio frequency coil 4, but this requires the use of a separate shield. It has been proposed (British patent application no. 98 11445.7) to use an array of transmitting coils to generate a radio frequency excitation pulse which collapses in the region D.

Arrays of coils have been used before as transmitting or receive radio frequency coils and, it has been proposed (British patent application no. 98 28428.4) to use an array of receive coils in the region of good field (from A to B) in order to reduce the number of slice encode steps which would otherwise be needed to distinguish between different simultaneously excited radial slices.

SUMMARY OF THE INVENTION

The invention provides magnetic resonance apparatus, comprising means for producing a main magnetic field and a magnetic field gradient in a desired signal region, radio frequency means for exciting magnetic resonance in a volume of the desired signal region, a primary radio frequency receive coil for receiving MR signals from the desired signal region, an additional radio frequency receive coil for receiving MR signals from an alias region outside the desired excited volume, in which alias region the magnetic field has a value equal to that in the desired excited volume, and processing means for producing data from the desired excited volume which uses signals from the additional radio frequency receive coil as well as from the primary radio frequency receive coil in order to reduce artefacts caused by aliasing in the data produced from the desired excited volume.

The invention takes a different approach to that of shielding or nulling out the radio frequency signal in that a radio frequency coil is provided for collecting the alias signal, and the signal is then used to reduce the effect of aliasing on the desired data.

The present invention provides the foregoing and other features hereinafter described and particularly pointed out in the claims. The following description and accompanying drawings set forth certain illustrative embodiments of the invention. It is to be appreciated that different embodiments of the invention may take form in various components and arrangements of components. These described embodiments being indicative of but a few of the various ways in which the principles of the invention may be employed. The drawings are only for the purpose of illustrating a preferred embodiment and are not to be construed as limiting the invention.

BRIEF DESCRIPTION OF THE DRAWINGS

The foregoing and other features and advantages of the present invention will become apparent to those skilled in the art to which the present invention relates upon consideration of the following detailed description of a preferred embodiment of the invention with reference to the accompanying drawings, wherein.

DETAILED DESCRIPTION

Figure 3:
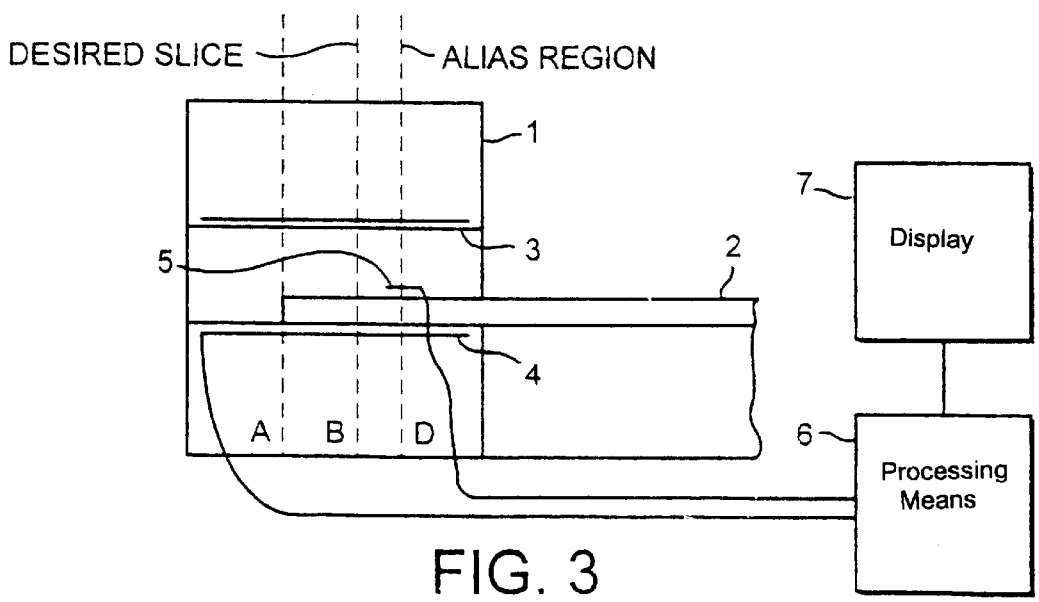
FIG. 3 is a schematic sectional view of magnetic resonance imaging apparatus in accordance with the invention.

Referring to FIG. 3, the magnetic resonance imaging apparatus comprises a magnet 1 producing a main field in a direction along the axis of a bore 3, into which a patient is moved on a couch 2. Gradient coils (not shown) are provided for setting up magnetic field gradients in the x, y and z directions. The z direction is assumed to be along the axis of the bore. Transmit/receive coil 4 is responsible for providing radio frequency excitation pulses for exciting magnetic resonance in a desired slice.

In processing means 6, the signals generated by the imaging (primary) coil 4 are resolved into co-ordinates in the plane of the slice B. The image could be of a radial slice anywhere from A to B, selected by appropriate choice of frequency of radio frequency excitation pulse. Further, more than one slice could be imaged, a volume could be imaged by generating contiguous slices, and the slices need not be perpendicular to the axis of the bore, they could in fact be perpendicular to any direction. An image of the slice or images of the slices selected are passed to display 7.

Figure 1:
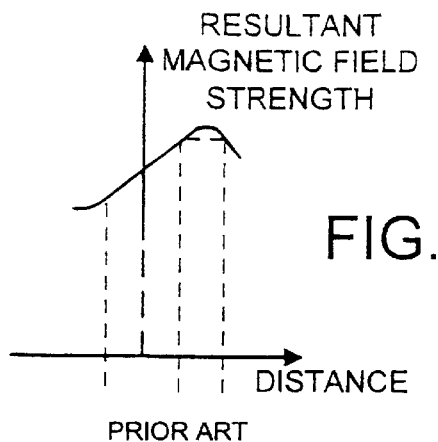
FIG. 1 represents the variation of magnetic field strength in a known magnetic resonance imaging apparatus.
Figure 2:
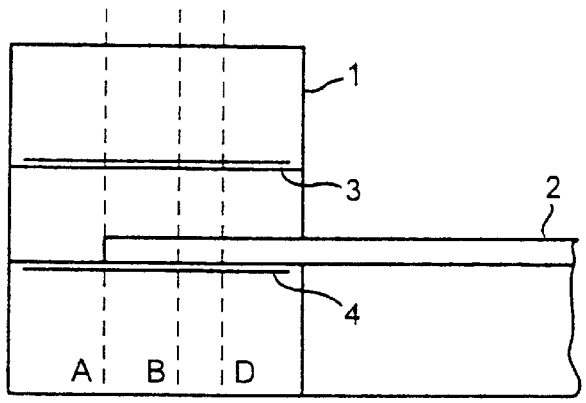
FIG. 2 is a schematic sectional view of the known magnetic resonance imaging apparatus.

As described thus far, the magnetic resonance imaging apparatus of FIG. 3 is the same as the known apparatus of FIG. 2, and has the same variation of magnetic field strength with distance i.e. that of FIG. 1. The apparatus of FIG. 3 is thus typical of those with short magnets.

Referring to the FIG. 3, the dotted lines marked A, B and D indicate the same strengths of magnetic field as for the known magnetic resonance imaging apparatus described with reference to FIGS. 1 and 2. In accordance with the invention, an additional receive coil 5 is placed in the alias region. The output from this coil 5, as well as from the primary transmit/receive coil 4, are passed to processing means 6 which is connected to the display 7 for displaying the image produced by the magnetic resonance imaging apparatus.

In the same way as imaging coil 4 picks up MR signals from the alias region as well as from the desired slice, alias coil 5 picks up MR signals from the desired slice as well as the alias region, and the effect of alias region on the desired slice is calculated and reduced or eliminated. More generally, artefacts are produced whenever two regions of space have the same field strength as a result of adverse fringe combinations of the gradient and main magnetic fields. The invention aims to reduce or eliminate these artefacts.

Figure 4:
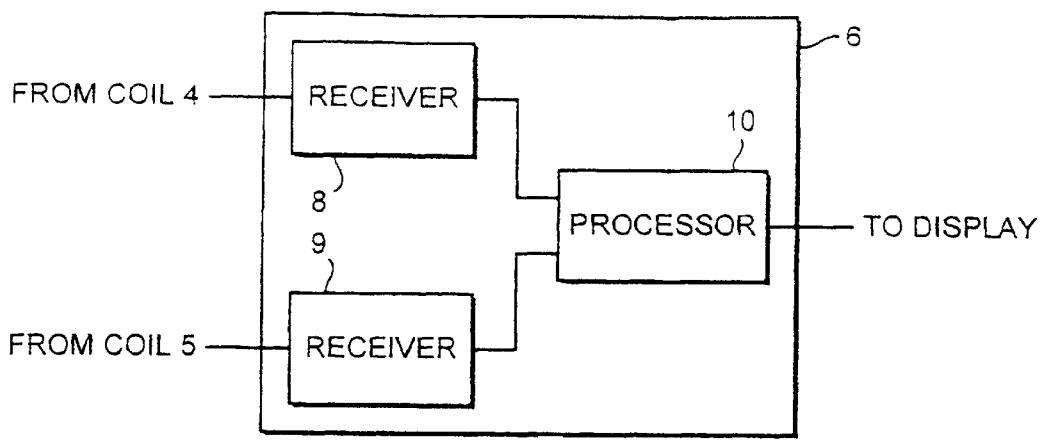
FIG. 4 is a block diagram of the processing means of FIG. 3.

Referring to FIG. 4, the signals received from imaging coil 4 are digitised and processed in receiver 8. In the case of a single slice (desired slice) being imaged, the pulse sequences applied and subsequent processing of the acquired raw data produces a two-dimensional matrix of image intensity corresponding to the imaged slice, although unlike the image data matrices produced by known apparatuses, the data is complex. In the usual way, the amplitude frequency and phase of the raw data determines the image data matrix. The array of pixels of the image data matrix corresponds to an array of physical spatial locations in the desired slice.

The same processing is carried out in receiver 9 on digitised signals received from the alias coil 5. An array of pixels forming an image data matrix is again produced. However, this time the physical spatial locations are likely to be mapped non-linearly into the array of pixels. While for simplicity of explanation, the alias coil is shown as imaging a slice in radial plane D, in fact the alias region will almost certainly not be a well-defined slice.

The reason for this is that the resultant magnetic field strength, which is a combination of the main field and the gradient field, falls off in the region of slice 2 in an uncontrolled manner. The resultant magnetic field is only carefully controlled in the imaging region from A to B.

Thus, one pixel might correspond to a very large volume of physical space, while another might correspond to zero volume of space. Each pixel in the image data matrix corresponds to a pixel with the same row and column co-ordinates in the alias image data matrix. The data acquired from the imaging coil 4 and the alias coil 5 are obtained using the same acquisition sequence and produce corresponding image matrices. However, data from the imaging coil produces a faithful representation of the spatial distribution of spins within the desired slice, whereas the data from the alias coil is likely to produce a highly distorted representation of the distribution of spins in the artefact region. This is because when the required imaging gradient is applied in the desired slice region, uncontrolled fringe effects are produced in the alias regions. The data from the imaging coil and the alias coil are each processed by Fourier Transformation in exactly the same way.

Unlike a conventional image data matrix, in which each pixel represents a modulus of a complex number, each pixel in the image data matrix and the alias image data matrix of the invention is a complex quantity.

Each pixel in the image data matrix and each pixel in the alias data matrix may contain a significant contribution from either the desired region or the alias region or both.

A knowledge of the sensitivity of each coil, for each individual pixel, to its own and the other excited volume, is used to compensate each pixel of the image data matrix for the alias effect. This is done in processor 10.

The equations used for the correction are as follows, in which the following definitions apply, for any particular pixel, the terms all being complex:

$I_i$ represents the intensity of a pixel in the image data matrix as detected by the imaging coil 4, $I_a$ represents the intensity of the same pixel in the alias data matrix as detected by the alias coil 5, $I_1$ is the corrected intensity of that pixel in the image data matrix i.e. the intensity due only to the excitation in the desired slice, $I_2$ is the intensity of that pixel in the alias data matrix due only to the excitation in the alias region, $Si_1$ is the sensitivity of the imaging coil 4 to MR signals generated in the desired slice, $Si_2$ is the sensitivity of the imaging coil 4 to MR signals generated in the alias region, $Sa_1$ is the sensitivity of the alias coil 5 to MR signals generated by the desired slice, $Sa_2$ is the sensitivity of the alias coil to signals generated in the alias region, $\overline{\overline{S}}$ is a matrix of various terms, $\overline{\overline{S}}^{-1}$ is the inverse of the matrix S.

The detected intensity of a pixel in the image data matrix can thus be represented by the following equation:

$$Ii = Si_1 I_1 + Si_2 I_2$$

The detected intensity of the same pixel in the alias image data matrix can be represented by the following equation:

$$Ia = Sa_1 I_1 + Sa_2 I_2$$

These two terms can be represented as a matrix (now using the term in its mathematical sense):

$$\begin{pmatrix} Ii \\ Ia \end{pmatrix} = \begin{pmatrix} Si_1 & Si_2 \\ Sa_1 & Sa_2 \end{pmatrix} \begin{pmatrix} I_1 \\ I_2 \end{pmatrix}$$

This matrix equation can be summarised as follows:

$$I_{coil} = \underline{\underline{S}} I_{slice}$$

The simultaneous equations can be solved to enable the actual intensity generated by each slice to be calculated, and the solution may be represented in the following general way:

$$I_{slice} = \underline{\underline{S}}^{-1} I_{coil}$$

A knowledge of $\underline{\underline{S}}^{-1}$ therefore enables the corrected intensity to be obtained without being combined with MR contributions from the alias region. This above calculation to produce $I_1$ must therefore be carried out for each pixel of the image data matrix of the slice being imaged.

Normal imaging sequences are used. For example, a slice select gradient is applied in the z-direction when applying the radio frequency pulse. A frequency encoding gradient is applied during read out to decode the MR signal in one direction of the slice. Phase-encoding gradients of varying magnitudes and switched on and off prior to read out to decode the MR signal in the orthogonal direction. For each excitation pulses, two signals are measured i.e. that from the imaging coil and that from the alias coil.

Of course in order to solve the above equations, it is necessary to know the sensitivity terms in the matrix. These sensitivity terms will of course apply to each pixel of the image, and will probably be different for each pixel of the image. These values of sensitivity for each pixel may be determined by placing a uniform phantom first in the desired slice location and then in the aliasing region. Placing the phantom in the slice location enables terms $Si_1$ and $Sa_1$ to be obtained and the placing of the phantom in the aliasing region enables the terms $Si_2$ and $Sa_2$ to be obtained, again for each pixel of the radial plane.

While the discussion has related to slice select artefacts, the invention is not restricted to these. A particularly important application of the invention is imaging when the phase encode direction is head-foot. This can be corrected for in a similar manner to the slice selection example.

In the example described above, both sensitivity data and experimental data were collected using the same sequence. The correction would not work for a different sequence. This is not however a general limitation. A general formulation would require maps for any arbitrary sequence, and this can be achieved by field maps of Bo and the gradient fields, and the sensitivity profile of the receive coil employed. As an alternative to using phantoms to determine the sensitivity terms, the sensitivity terms may therefore be calculated directly from a knowledge of the mapping of the spatial distribution of the gradient fields and of the main field, both in the alias region and in the imaging region. This sequence dependent information would then be combined with the coil sensitivity profile to yield an overall system sensitivity for each coil for each pixel in the final image data.

In practice the pixels in the final images will be adversely affected by noise if the pair of equations whose coefficients are represented by S are ill-conditioned. Problems can arise when the alias region is mapped into the image domain in a highly distorted non-linear way. There are two cases to consider:

(i) Regions of the images which contain both slice data and artefactual signals. In these regions ($Si_1$, $Si_2$, $Sa_2$) are all large and, provided the coils have different sensitivities to the in-slice signal (i.e. $Si_1/Si_2 \neq Sa_1/Sa_2$), the modulus of the determinant of S will be large and the extracted data will have the artefact removed without much noise added.

(ii) Regions of the image which contain slice data but no artefactual signals of significant magnitude. In these regions $Si_2$ and $Sa_2$ are both small, the modulus of the determinant of S is likely to be small and multiplication by $\underline{\underline{S}}^{-1}$ will be likely to amplify noise from the correction coil and add it to the signal data without removing significant artefactual content. This represents a corruption with no gain.

A solution to noise amplification in type (ii) regions is to identify them by testing for small values of the modulus of det [S], i.e. |det [S]|<half the maximum value of |det [S]| and, for those pixels, retain an appropriately scaled copy of the original image data from the primary coil 4 only.

Figure 5:
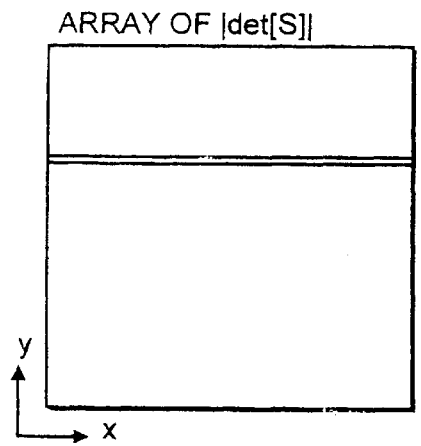
FIG. 5 is a representation of an array of values of a mathematical quantity used in the processing means.
Figure 6:
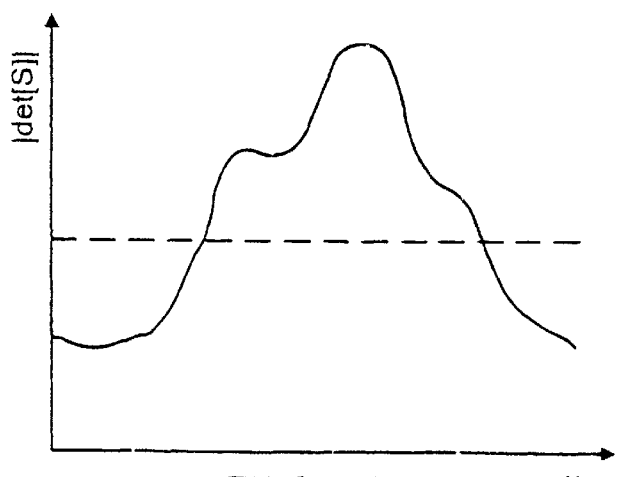
FIG. 6 is a graphical representation of the variation of that mathematical quantity along one line of the array.

Referring to FIGS. 5 and 6, FIG. 5 represents a data matrix that corresponds to the image data matrix but for which each pixel contains the value of |det [S]|. The modulus of det [S] has a particular value for each pixel. One line of pixels is drawn in, and FIG. 6 is a graph showing the variation of |det [S]| along the line.

In one example, a threshold was established at half the maximum value of |det [S]| across the entire array. Scaled original data was used for those pixels beneath the threshold, while the correction indicated by the equations discussed was used for the pixels above the threshold. The threshold may be set anywhere between one quarter and three quarters of the maximum value of |det [S]| and in fact there would be some advantage to using a threshold anywhere between 20% and 90% of the maximum value of |det [S]|.

EXAMPLE

The methods referred to above were tested using a 1.0 T Picker prototype neonatal scanner which has a 38 cm long bore and produces out of slice artefacts at approximately 10 cm from the isocentre for a conventional spin echo sequence. The coil 4 was a birdcage body coil centred at the magnetic isocentre. The alias coil 5 was a 7 cm loop surface coil positioned 10 cm away from the isocentre at a location where it was known that the signal was folded into the main image. Sensitivity maps of the two coils 4 and 5 were obtained by imaging a uniform 19 cm diameter copper sulphate phantom. The phantom was first located at the isocentre, and was then moved to the location of the source of the artefact and imaged with both radio frequency coils in each case. Image data to be corrected was collected by placing a 20 cm long 6 cm diameter structured phantom in the bore such that the phantom extended over the region containing the isocentre and the foldover (alias) location. Images were obtained with both radio frequency coils. Anatomical data was collected by substituting an adult human forearm for the long structured phantom. Spin echo imaging parameters were TE 20 msec, TR 200 msec, FOV 20 cm, slice thickness 5 mm, 25 sec acquisition. Complex image data was collected in all cases. The stray field artefact was satisfactorily removed from the data images as described above.

While a particular feature of the invention may have been described above with respect to only one of the illustrated embodiments, such features may be combined with one or more other features of other embodiments, as may be desired and advantageous for any given particular application.

From the above description of the invention, those skilled in the art will perceive improvements, changes and modification. Such improvements, changes and modification within the skill of the art are intended to be covered by the appended claims.

For example, variations are possible from the above described embodiments without departing from the scope of the invention. Thus, the imaging coil 4 need not be a birdcage coil. Other types of coil are possible. As an example, the imaging coil could consist of an array of coils. In this case, the alias coil could consist of another coil on the end of the array.

The alias coil need not be a surface coil but could be another body coil. More than one alias coil may be provided if desired.

While the invention has been described in relation to a short magnet, the invention is also applicable to long magnets where artefacts could be a problem. Two examples are a long magnet combined with a small gradient coil and/or where the phase encode direction is head-foot.

There is no restriction to imaging a slice, the invention being applicable to three-dimensional volume imaging. In this case an alias region of voxels would be defined, on a one-for-one basis with the voxels of the desired excited volume.

Various types of pulse sequence may be used, as may be various methods for producing the image data matrix to be corrected.

The invention is not restricted to a magnet with a bore, but applies to an open magnet.

Finally, the invention is not restricted to imaging, and is applicable to magnetic resonance spectroscopy for example medical spectroscopy used for chemical analysis.

Having described a preferred embodiment of the invention, the following is claimed:

1. A magnetic resonance apparatus comprising:
   a main magnet for producing a main magnetic field;
   a gradient coil for producing a magnetic field gradient in a desired region;
   a radio frequency transmit coil for providing a signal inducing magnetic resonance in an excited volume within the desired region;
   a first radio frequency receive coil for receiving desired and alias MR signals, the desired and alias signals received primarily from the desired region and secondarily from an alias region outside the excited volume, respectively;
   a second radio frequency receive coil for receiving alias and desired MR signals, the alias and desired signals received primarily from the alias region and secondarily from the desired region, respectively; and
   a processor for producing data corresponding to the excited volume, the processor operating on the desired and alias signals received from the first radio frequency coil and on the desired and alias signals received from the second radio frequency coil to reduce artifacts caused by the signals from the alias region.

2. The magnetic resonance apparatus of claim 1, wherein the signals primarily received by the second coil are induced in the alias region from the signal inducing magnetic resonance in the excited volume within the desired region.

3. The magnetic resonance apparatus of claim 1 wherein the radio frequency transmit coil is a combined transmit/receive coil and also serves as one of either the first or second radio frequency receive coil.

4. The magnetic resonance apparatus of claim 1 wherein the processor includes a coil sensitivity processor for modifying the data corresponding to the excited volume and the data corresponding to the alias region by the sensitivity of both of the first and second receive coils to excitation by signals from both of the desired excited volume and signals from the alias region.

5. The magnetic resonance apparatus of claim 4 wherein the coil sensitivity processor includes matrix processing means.

6. A magnetic resonance apparatus comprising:
   means for producing a main magnetic field;
   means for producing a magnetic field gradient in a desired region;
   radio frequency means for exciting magnetic resonance in a volume of the desired region;
   a first radio frequency receive coil for receiving desired and alias MR signals, the desired and alias signals received primarily from the desired region and secondarily from an alias region outside the excited volume, respectively;
   a second radio frequency receive coil for receiving alias and desired MR signals, the alias and desired signals received primarily from the alias region and secondarily from the desired region, respectively, in which alias region the magnetic field has a value equal to that in the desired excited volume; and
   processing means for producing data from the desired excited volume which uses the desired and alias signals from the second radio frequency receive coil as well as from the first radio frequency receive coil in order to reduce artefacts caused by aliasing in the data produced from the desired excited volume.

7. The magnetic resonance apparatus as claimed in claim 6, wherein the processing means is arranged to process the data of the excited volume on a pixel by pixel basis using values of the sensitivity of each coil to excitation by the desired excited volume and the alias region, for each respective pixel.

8. The magnetic resonance apparatus as claimed in claim 7, wherein the processing means is arranged to process the data of the excited volume on a pixel by pixel basis using a matrix of the values of the sensitivity of each coil to excitation by the desired volume and the alias region.

9. The magnetic resonance apparatus as claimed in claim 8, wherein the processing means is arranged to process the data of the excited volume on a pixel by pixel basis excluding data from the additional coil for those pixels for which the modulus of the determinant of the matrix lies below a threshold value.

10. The magnetic resonance apparatus as claimed in claim 9, wherein the threshold value lies within the range of 20% to 90% of the peak value of the modulus of the determinant of the matrix over all the pixels.

11. The magnetic resonance apparatus as claimed in claim 10 wherein the threshold value lies within the range of 25% to 75% of the peak value of the modulus of the determinant of the matrix over all the pixels.

12. The magnetic resonance imaging apparatus as claimed in claim 6, wherein the additional radio frequency coil is a surface coil.

13. A method of obtaining magnetic resonance data, the method comprising the steps of:
   producing a main magnetic field;
   producing magnetic field gradients in a desired region;
   exciting magnetic resonance in a volume of the desired region with a radio frequency signal;
   receiving desired and alias MR signals from the volume of the desired region and an alias region outside the excited volume, respectively, using a primary receiving coil;

receiving desired and alias MR signals from the desired region and the alias region using a second radio frequency receive coil, the MR signals from the alias region induced by the radio frequency signal; and processing the desired and alias signals from the primary coil and the second coil in order to modify the data corresponding to the volume of the desired region.

14. The method of claim 13, wherein the step of processing further includes the step of producing data with reduced artefacts caused by aliasing.

15. The method of claim 13, including the step of placing phantoms at the desired region and the alias region to calculate the sensitivity of the primary and alias coils to both the desired signal and alias regions.

16. The method of obtaining magnetic resonance data as claimed in claim 15, wherein the step of processing includes the step of modifying the data of the excited volume on a pixel by pixel basis using values of the sensitivity of each coil to excitation by the desired excited volume and the alias region, for each respective pixel.

17. The method of obtaining magnetic resonance data as claimed in claim 16, wherein the step of processing includes the step of modifying the data of the excited volume on a pixel by pixel basis using a matrix of the values of the sensitivity of each coil to excitation by the desired volume and the alias region.

18. The method of obtaining magnetic resonance data as claimed in claim 17 wherein the step of processing includes the step of modifying the data of the excited volume on a pixel by pixel basis comprises the step of excluding data from the additional coil for those pixels for which the modulus of the determinant of the matrix lies below a threshold value.

19. The method of obtaining magnetic resonance data as claimed in claim 18, wherein the threshold value lies within the range of 20% to 90% of the peak value of the modulus of the determinant of the matrix over all the pixels.

20. The method of obtaining magnetic resonance data as claimed in claim 19 wherein the threshold value lies within the range of 25% to 75% of the peak value of the modulus of the determinant of the matrix over all the pixels.

* * * * *